(12) United States Patent
Jiang et al.

(10) Patent No.: US 7,682,658 B2
(45) Date of Patent: Mar. 23, 2010

(54) METHOD FOR MAKING CARBON NANOTUBE ARRAY

(75) Inventors: Kai-Li Jiang, Beijing (CN); Kai Liu, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 315 days.

(21) Appl. No.: 11/371,989

(22) Filed: Mar. 8, 2006

(65) Prior Publication Data

US 2006/0269668 A1 Nov. 30, 2006

(30) Foreign Application Priority Data

Mar. 16, 2005 (CN) .................. 2005 1 0033699

(51) Int. Cl.
*C23C 16/00* (2006.01)
(52) U.S. Cl. ............... 427/248.1; 427/249.1; 427/249.6
(58) Field of Classification Search .... 427/248.1–255.7
See application file for complete search history.

(56) References Cited

U.S. PATENT DOCUMENTS

| | | | |
|---|---|---|---|
| 5,374,415 A | 12/1994 | Alig et al. | |
| 6,177,292 B1 | 1/2001 | Hong et al. | |
| 6,232,706 B1 * | 5/2001 | Dai et al. .................. | 313/309 |
| 6,315,977 B1 | 11/2001 | Cantacuzene | |
| 6,350,488 B1 * | 2/2002 | Lee et al. ................. | 427/249.1 |
| 6,569,765 B1 | 5/2003 | Solomon et al. | |
| 6,627,552 B1 | 9/2003 | Nishio et al. | |
| 6,656,285 B1 | 12/2003 | Melnik et al. | |
| 6,706,119 B2 | 3/2004 | Tsvetkov et al. | |

(Continued)

FOREIGN PATENT DOCUMENTS

CN 1266018 9/2000

(Continued)

OTHER PUBLICATIONS

Moshkalyov et al., Carbon nanotubes growth by chemical vapor deposition using thin film nickel catalyst, Sep. 25, 2004, Materials Science and Engineering B, vol. 112, Issues 2-3, pp. 147-153.

(Continued)

*Primary Examiner*—Michael Cleveland
*Assistant Examiner*—Michael G Miller
(74) *Attorney, Agent, or Firm*—D. Austin Bonderer

(57) ABSTRACT

A method for making an array of carbon nanotubes includes the steps of: (a) providing a substrate with a film of a first catalyst thereon; (b) disposing the substrate in a quartz boat; (c) disposing a second catalyst adjacent to the substrate in the quartz boat; (d) disposing the quartz boat in a reaction chamber having a gas inlet configured for introducing a carbon source gas and a carrier gas into the reaction chamber and a gas outlet; (e) heating the reaction chamber to a predetermined temperature and introducing the carbon source gas into the reaction chamber along a direction from the second catalyst to the substrate, whereby the second catalyst reacts with the carbon source gas thereby producing a resultant for promoting catalytic activity of the first catalyst; and (f) growing an array of carbon nanotubes on the substrate.

18 Claims, 4 Drawing Sheets

U.S. PATENT DOCUMENTS

| | | |
|---|---|---|
| 6,768,135 B2 | 7/2004 | Solomon et al. |
| 6,936,357 B2 | 8/2005 | Melnik et al. |
| 7,214,360 B2 | 5/2007 | Chen et al. |
| 7,276,121 B1 | 10/2007 | Bliss et al. |
| 7,279,047 B2 | 10/2007 | Melnik et al. |
| 7,288,321 B2 | 10/2007 | Liu et al. |
| 2002/0132495 A1 | 9/2002 | Siegel et al. |
| 2002/0172767 A1 | 11/2002 | Grigorian et al. |
| 2003/0039750 A1 | 2/2003 | Mao et al. |
| 2004/0018416 A1* | 1/2004 | Choi et al. .................... 429/44 |
| 2004/0105807 A1* | 6/2004 | Fan et al. ................. 423/447.3 |
| 2004/0136896 A1* | 7/2004 | Liu et al. ................. 423/447.3 |
| 2004/0253167 A1 | 12/2004 | Silva et al. |
| 2005/0046322 A1 | 3/2005 | Kim et al. |
| 2005/0089467 A1 | 4/2005 | Grill et al. |
| 2005/0112051 A1 | 5/2005 | Liu et al. |
| 2005/0271829 A1 | 12/2005 | Kumar et al. |

FOREIGN PATENT DOCUMENTS

| | | |
|---|---|---|
| JP | 2000281304 A | 10/2000 |
| JP | 2004250306 A | 9/2004 |

OTHER PUBLICATIONS

Cassell et al., Large scale CVD synthesis of Single Walled Carbon Nanotubes, Jun. 1, 1999, J. Phys. Chem. B 103, 6484-6492.

Li, W Z et. al., Large-scale synthesis of aligned carbon nanotubes, Science, 274, 1701-1703.

* cited by examiner

METHOD FOR MAKING CARBON NANOTUBE ARRAY

RELATED APPLICATIONS

This application is related to commonly-assigned applications entitled, "APPARATUS AND METHOD FOR MAKING CARBON NANOTUBE ARRAY", filed Mar. 8, 2006, Ser. No. 11/371,997, "APARATUS FOR MAKING CARBON NANOTUBE ARRAY", filed Mar. 8, 2006, Ser. No. 11/371,992, and "METHOD FOR MAKING CARBON NANOTUBE ARRAY", filed Mar. 8, 2006, Ser. No. 11/371, 993. Disclosures of the above-identified applications are incorporated herein by reference.

BACKGROUND

1. Technical Field

The invention relates generally to methods for making carbon nanotubes, and more particularly to a method for making an array of carbon nanotubes.

2. Discussion of Related Art

Carbon nanotubes were discovered by S. Iijima in 1991, they are very small tube-shaped structures, each essentially having composition similar to that of a graphite sheet rolled into a tube. Theoretical studies showed that carbon nanotubes exhibit either metallic or semiconductive behavior depending on the radii and helicity of the tubules. Carbon nanotubes have interesting and potentially useful electrical and mechanical properties, and have many potential uses in electronic devices. Carbon nanotubes also feature extremely high electrical conductivity, very small diameters (much less than 100 nanometers), large aspect ratios (i.e. length/diameter ratios greater than 1000), and a tip-surface area near the theoretical limit (the smaller the tip-surface area, the more concentrated the electric field, and the greater the field enhancement factor). These features make carbon nanotubes ideal candidates for electron field emitters, white light sources, lithium secondary batteries, hydrogen storage cells, transistors, and cathode ray tubes (CRTs).

Generally, there are three methods for manufacturing carbon nanotubes. The first method is the arc discharge method, which was first discovered and reported in an article by Sumio Iijima entitled "Helical Microtubules of Graphitic Carbon" (Nature, Vol. 354, Nov. 7, 1991, pp. 56-58). The second method is the laser ablation method, which was reported in an article by T. W Ebbesen et al. entitled "Large-scale Synthesis of Carbon Nanotubes" (Nature, Vol. 358, 1992, pp. 220). The third method is the chemical vapor deposition (CVD) method, which was reported in an article by W Z. Li entitled "Large-scale Synthesis of Aligned Carbon Nanotubes" (Science, Vol. 274, 1996, pp. 1701).

In the arc discharge method, a carbon vapour is created by an arc discharge between two carbon electrodes either with or without a catalyst. Carbon nanotubes then self-assemble from the resulting carbon vapour. In the laser ablation technique, high-powered laser pulses impinge on a volume of carbon-containing feedstock gas (methane or carbon monoxide). Carbon nanotubes are thus condensed by the laser ablation and are deposited on an outside collector. However, the carbon nanotubes produced by the arc discharge and the laser ablation vary greatly in diameter and length, with little control over the dimensions of the resulting nanotubes. Moreover, poor carbon nanotube yield and prohibitive cost involved in making the device mean that the two methods difficult to scale up to suit industrial production.

In the chemical vapour deposition (CVD) method, carbon filaments and fibers are produced by thermal decomposition of a hydrocarbon gas on a transition metal catalyst in a chemical vapour deposition reaction chamber. In general, the chemical vapour deposition process results in both multi-walled nanotubes (MWNTs) and single-walled nanotubes (SWNTs) being produced. Compared with the arc discharge method and laser ablation method, the chemical vapour deposition method is a more simple process and can easily be scaled up for industrial production. However, the carbon nanotubes manufactured by the chemical vapour deposition process aren't bundled to form an array, thus the CVD process can't assure both quantity and quality of production.

In view of the above, another method, such as a thermal chemical vapor deposition method is disclosed where an array of carbon nanotubes are formed vertically aligned on a large-size substrate. The thermal CVD method includes the steps of: forming a metal catalyst layer on a substrate; etching the metal catalyst layer to form isolated nano-sized catalytic metal particles; growing carbon nanotubes from said isolated nano-sized catalytic metal particles by the thermal chemical vapor deposition (CVD) process; and purifying the carbon nanotubes in-situ.

The carbon nanotubes formed by the above-described method are vertically aligned on the substrate. However, the above-described method is a rather complicated process. Furthermore, excess amorphous carbon lumps and metal catalyst lumps are also produced along with the carbon nanotubes and adhered to inner or outer sidewalls of the carbon nanotubes. Thus, the above-described method requires a complicated purification processes. Moreover, the above-described method is performed at a temperature in the range from 700° C. to 1000° C., thus it is difficult to mass synthesize the carbon nanotubes due to the high synthesis temperature. Furthermore, the carbon nanotubes formed in the above-described method are generally comprised of MWNTs and SWNTs. These mixed carbon nanotubes do not sufficiently exhibit the useful properties of a single-type array of carbon nanotubes.

What is needed, therefore, is a method for making a carbon nanotube array that is easy to operate, uses a simple process, and can form high purity carbon nanotube arrays.

SUMMARY

A method for making an array of carbon nanotubes includes the steps of (a) providing a substrate with a film of a first catalyst thereon;

(b) disposing the substrate in a quartz boat;

(c) disposing a second catalyst adjacent to the substrate in the quartz boat;

(d) disposing the quartz boat in a reaction chamber having a gas inlet configured for introducing a carbon source gas and a carrier gas into the reaction chamber and a gas outlet;

(e) heating the reaction chamber to a predetermined temperature and introducing the carbon source gas into the reaction chamber along a direction from the second catalyst to the substrate, whereby the second catalyst reacts with the carbon source gas thereby producing a resultant which promotes the catalytic activity of the first catalyst; and (f) growing an array of carbon nanotubes on the substrate.

A method for making an array of carbon nanotubes includes the steps of:

(a) providing a substrate with a film of a first catalyst thereon;

(b) disposing the substrate and a second catalyst in a tubular boat, the tubular boat having an open end configured for introducing of a carbon source gas thereinto and an opposite closed end configured for blocking and directing the introduced carbon source gas in the boat to flow toward the substrate, the second catalyst being configured for reaction with the carbon source gas thereby producing a resultant which promotes the catalytic activity of the first catalyst, the second catalyst being disposed in the boat in a manner to enable the resultant associated with the second catalyst to forcedly flow toward the substrate;

(c) disposing the quartz boat in a reaction chamber having a gas inlet configured for introducing the carbon source gas and a carrier gas into the reaction chamber and a gas outlet;

(d) heating the reaction chamber to a predetermined temperature and introducing the carbon source gas into the reaction chamber; and (e) growing an array of carbon nanotubes on the substrate.

Compared with conventional CVD methods for making carbon nanotube arrays, the methods in the described embodiments for making carbon nanotube arrays has the following advantages. Firstly, the present method can be used at a relatively low temperature, for example, in the range from 600 to 700° C. In the preferred embodiment of the method, an array of bundled and super-aligned carbon nanotubes can be synthesized at temperatures in the range from 620 to 690° C. Secondly, growth speed and yield of carbon nanotubes are both improved. After growing carbon nanotubes for 30 to 60 minutes, the carbon nanotube array has a height of a few hundred micrometers to a few millimeters. Thirdly, the present device and method for growing carbon nanotubes is inexpensive. The carrier and carbon source gases in the preferred method can be inexpensive argon and acetylene. Furthermore, usage of a second catalyst in accordance with the present method can avoid using expensive hydrogen in the method. That is, the danger and cost of the present method is relatively low compared to conventional methods.

Other advantages and novel features of the present method for making a carbon nanotube array will become more apparent from the following detailed description of preferred embodiments, when taken in conjunction with the accompanying drawings.

BRIEF DESCRIPTION OF THE DRAWINGS

Many aspects of the present method can be better understood with reference to the following drawings. The components in the drawings are not necessarily to scale, the emphasis instead being placed upon clearly illustrating the principles of the present method for making an array of carbon nanotubes.

Figure 1:
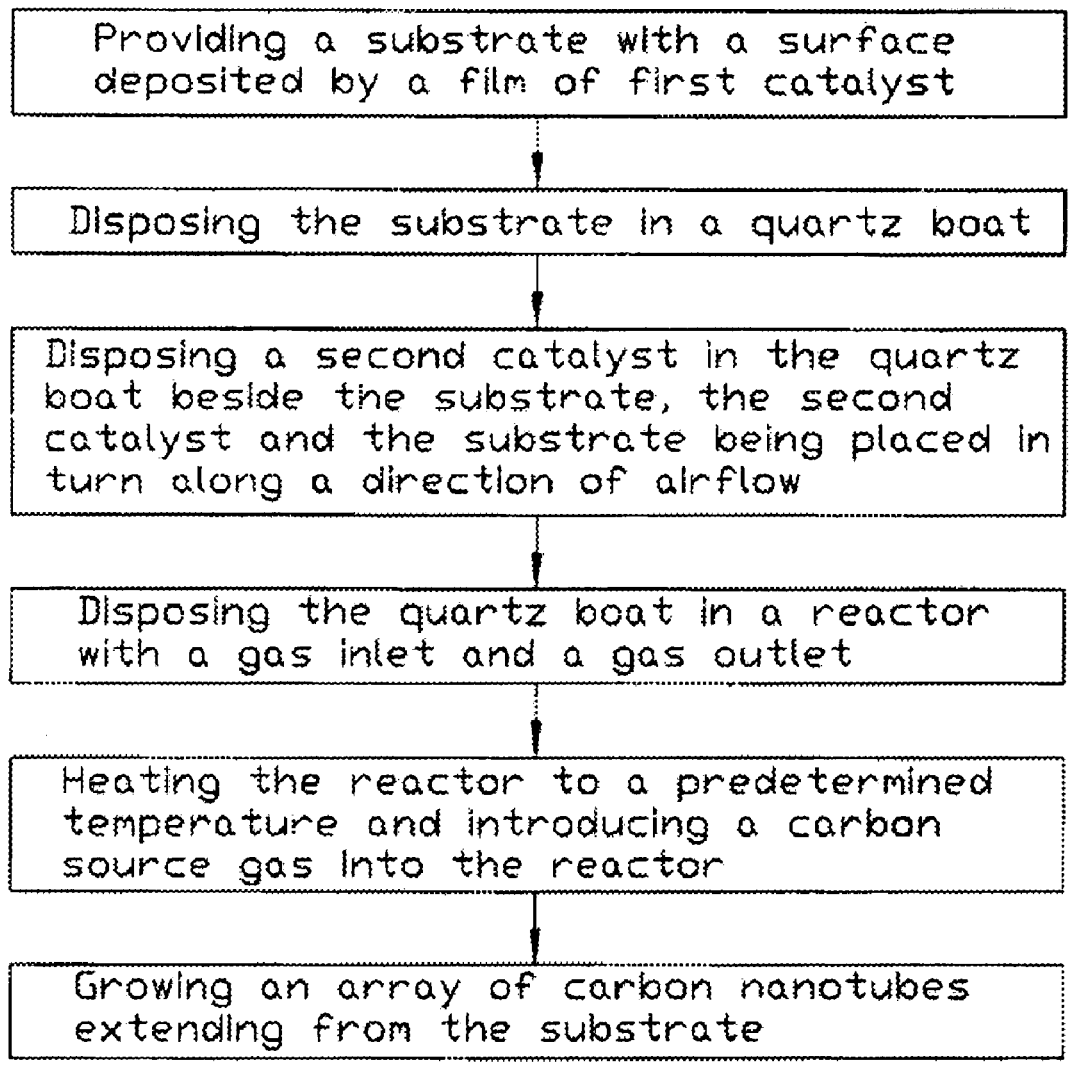
FIG. 1 is a flow chart of a method for making an array of carbon nanotubes in accordance with a preferred embodiment of the present invention.

Corresponding reference characters indicate corresponding parts throughout the several views. The exemplifications set out herein illustrate at least one preferred embodiment of the present method for making an array of carbon nanotubes, in one form, and such exemplifications are not to be construed as limiting the scope of the invention in any manner.

DETAILED DESCRIPTION OF PREFERRED EMBODIMENTS

Reference will now be made to the drawings to describe embodiments of the present method for making an array of carbon nanotubes, in detail.

Figure 2:
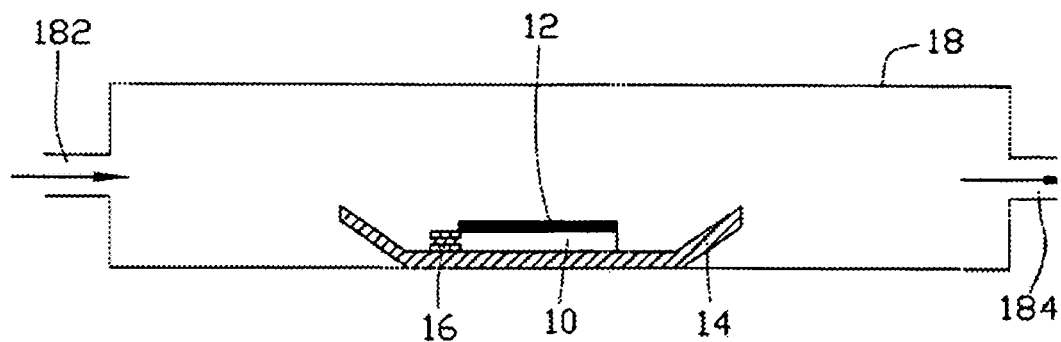
FIG. 2 is a schematic, cutaway view of an apparatus for making an array of carbon nanotubes in accordance with a first embodiment of the present method.
Figure 3:
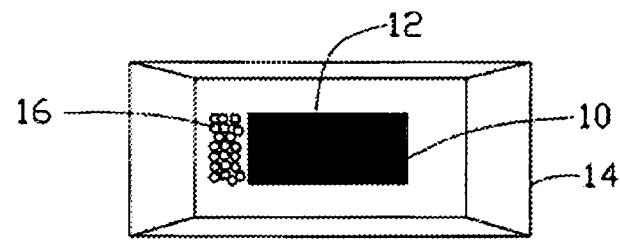
FIG. 3 is a top view of a quartz boat with a substrate and a second catalyst thereon of FIG. 2.
Figure 4:
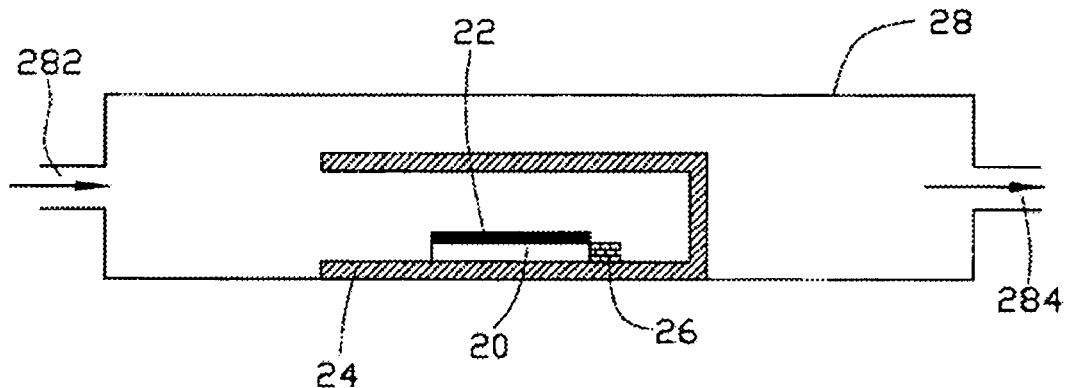
FIG. 4 is a schematic, cutaway view of an apparatus for making an array of carbon nanotubes in accordance with a second embodiment of the present method.
Figure 5:
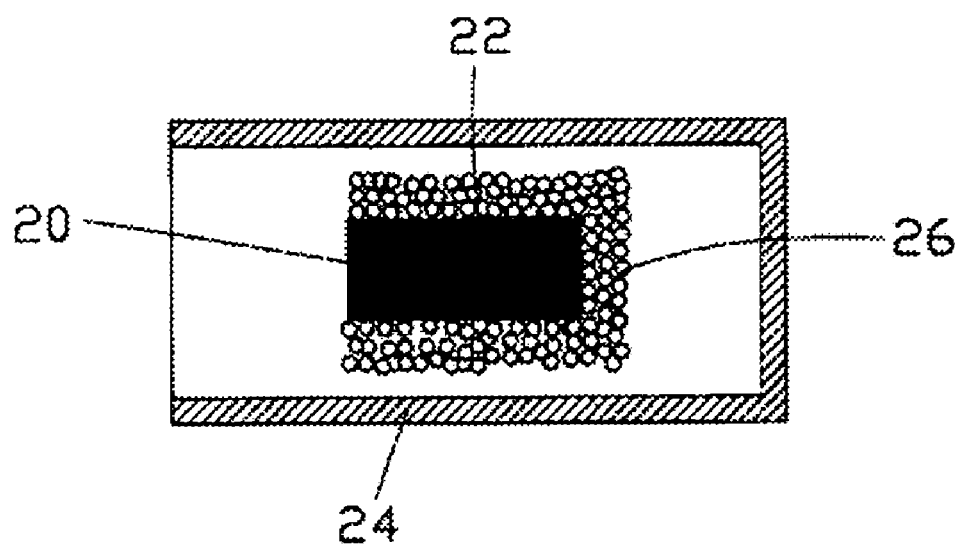
FIG. 5 is a sectional, top view of a quartz boat of FIG. 4.
Figure 6:
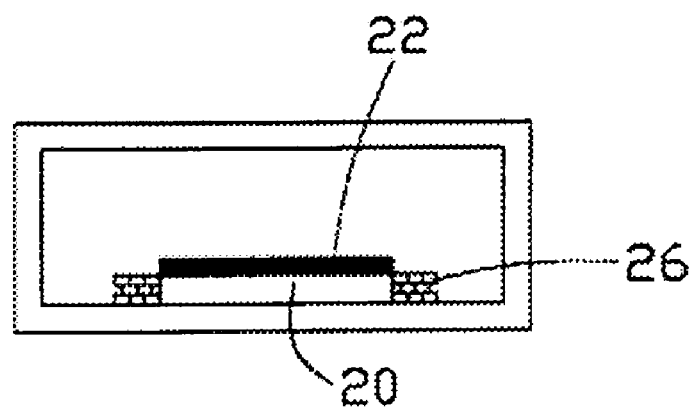
FIG. 6 is a side view of a quartz boat of FIG. 4.

Referring to FIGS. 1, 2 and 3, a first embodiment of the present method for making an array of carbon nanotubes is provided. The first embodiment includes the following steps in no particular order thereof. Firstly, a substrate 10 is provided, and a film of first catalyst 12 is formed on a surface of the substrate 10. The substrate 10 can be made of silicon, glass or quartz. In the preferred embodiment the substrate 10 is made of silicon. The film of first catalyst 12 is uniformly disposed on the surface of the substrate 10 by means of chemical vapor deposition, thermal deposition, electron-beam deposition, or sputtering. The first catalyst 12 can be made of iron (Fe), cobalt (Co), nickel (Ni), or any combination alloy thereof. In the preferred embodiment, the first catalyst 12 is made of iron.

Secondly, a quartz boat 14 and a second catalyst 16 are provided. The quartz boat 14 can be opened at opposite ends. In the preferred embodiment, the quartz boat 14 is cymbiform. Alternatively, the quartz boat 150 could be made by other suitable materials. The second catalyst 16 and the substrate 10 are disposed on a bottom of the quartz boat 14. The second catalyst 16 is disposed proximate to the substrate 10. The second catalyst 16 can be made of iron, nickel or alumina. In the preferred embodiment, the second catalyst 16 is iron.

Thirdly, a horizontal reaction chamber 18 with a gas inlet 182 and a gas outlet 184 is provided. The reaction chamber 18 can be a tubular container, and the gas inlet 182 and gas outlet 184 are located at two opposite ends of the reaction chamber 18 respectively. The gas inlet 182 is for introducing a carrier gas and a carbon gas. The quartz boat 14 is disposed on a bottom of the reaction chamber 18. A first route is defined in the reaction chamber 18 for the introduced carbon source gas flow from the second catalyst 16 to the substrate 10. The second catalyst 16 and the substrate 10 are disposed on the route. In the preferred embodiment, the second catalyst 16 is disposed proximate to at least one side of the substrate 10 far from the gas outlet 184.

Fourthly, a carrier gas is continuously introduced into the reaction chamber 18 from the gas inlet 182 at one atmosphere of pressure. The carrier gas is used to create an atmosphere of inert gas in the reaction chamber 18. Then, the reaction chamber 18 is heated gradually to a predetermined temperature. A carbon source gas which mixes with the carrier gas is introduced into the reaction chamber 18 from the gas inlet 182 for growing carbon nanotubes. The carrier gas can be a nitrogen ($N_2$) gas or a noble gas. The carbon source gas can be ethylene ($C_2H_4$), methane ($CH_4$), acetylene ($C_2H_2$), ethane ($C_2H_6$) or any combination thereof. In the preferred embodiment, the carrier gas is argon (Ar), and the carbon source gas is acetylene. A ratio of the carrier gas flow-rate to the carbon source gas flow-rate can be adjusted in the range from 5:1 to 10:1. In the preferred embodiment, the argon flow-rate is 300 sccm (Standard Cubic Centimeter per Minute), and the acetylene flow-rate is 30 sccm. The predetermined temperature used in the method can be in the range from 600 to 720° C. In the preferred embodiment, the predetermined temperature is in the range from 620 to 690° C.

Due to catalyzing by the first catalyst 12, the carbon source gas supplied into the reaction chamber 18 is pyrolyzed in a gas phase into carbon units (C=C or C) and free hydrogen ($H_2$). The carbon units are absorbed on a free surface of the first catalyst 12 and diffused into the first catalyst 12. When the first catalyst 12 is supersaturated with the dissolved carbon units, carbon nanotube growth is initiated. As the intrusion of the carbon units into the first catalyst 12 continues, an array of carbon nanotubes is formed. The array of the carbon nanotubes formed by the preferred embodiment is a multi-walled carbon nanotube array. Density, diameter and length of the multi-walled carbon nanotube array can be controlled by adjusting the flow rates of the carbon source gas and the carrier gas, and by altering the predetermined temperature and the reaction time. In addition, the second catalyst 16 used in the first embodiment can act on the carbon source gas. The second catalyst 16 can pyrolize the carbon source gas to produce small amounts of hydrogen gas which flows to the first catalyst 12. The additional hydrogen produced by the second catalyst 16 can activate the first catalyst 12, and further reduce the concentration of the carbon source gas around the first catalyst 12. As such, the growth speed of the carbon nanotubes is increased and the height of the array of the carbon nanotubes is enhanced. In the preferred first embodiment, the reaction time is in the range from 30 to 60 minutes. The synthesis method can produce carbon nanotubes with a length greater than 3-400 micrometers, and have a diameter in the range from 10 to 30 nanometers.

In addition, it is noted that the second catalyst 16 can be disposed in other place on the first route proximate to the substrate 10 in the quartz boat 14. Advantageously, the hydrogen produced by the second catalyst 16 and the carbon source gas can reach the first catalyst 12 along the route of airflow and activate the first catalyst 12 to improve the growth speed of the carbon nanotubes.

Referring to FIGS. 1, 4, 5 and 6, a second embodiment of the present method for making an array of carbon nanotubes is provided. The second embodiment includes the following steps in no particular order thereof. Firstly, a substrate 20 is provided, and a film of first catalyst 22 is formed on a surface of the substrate 20. The substrate 20 can be made of silicon, glass or quartz. In the preferred embodiment the substrate 20 is made of silicon. The film of first catalyst 22 is uniformly disposed on the surface of the substrate 20 by means of chemical vapor deposition, thermal deposition, electron-beam deposition, or sputtering. The first catalyst 22 can be made of iron (Fe), cobalt (Co), nickel (Ni), or any combination alloy thereof. In the preferred embodiment, the first catalyst 22 is made of iron.

Secondly, a quartz boat 24 and a second catalyst 26 are provided. The quartz boat 24 is tubular and includes one opened end. The second catalyst 26 and the substrate 20 are disposed on a bottom of the quartz boat 24. The second catalyst 26 is placed beside sides of the substrate 20. The second catalyst 26 can be made of iron, nickel or alumina. In the preferred embodiment, the second catalyst 26 is iron.

Thirdly, a horizontal reaction chamber 28 with a gas inlet 282 and a gas outlet 284 is provided. The gas inlet 282 is for introducing a carrier gas and a carbon source gas. The reaction chamber 28 can be a tubular container, and the gas inlet 282 and gas outlet 284 are located at two opposite ends of the reaction chamber 28 respectively The quartz boat 24 is disposed on a bottom of the reaction chamber 28, and the opened end of the quartz boat 24 is facing to the gas inlet 282. A second route is defined in the quartz boat 24 for the introduced carbon source gas flow from the second catalyst 26 to the substrate 20. The second catalyst 26 and the substrate 20 are disposed on the route. In the preferred embodiment, the second catalyst 26 is disposed proximate to at least three sides of the substrate 20 far from the gas inlet 282.

Fourthly, a carrier gas is introduced into the reaction chamber 28 from the gas inlet 282 at one atmosphere of pressure. The carrier gas is used to create an atmosphere of inert gas in the reaction chamber 28. Then, the reaction chamber 28 is heated gradually to a predetermined temperature. A carbon source gas which mixes with the carrier gas is introduced into the reaction chamber 28 from the gas inlet 282. The carrier gas can be a nitrogen ($N_2$) gas or a noble gas. The carbon source gas can be ethylene ($C_2H_4$), methane ($CH_4$), acetylene ($C_2H_2$), ethane ($C_2H_6$) or any combination thereof. In the preferred embodiment, the carrier gas is argon (Ar), and the carbon source gas is acetylene. A ratio of the carrier gas flow-rate to the carbon source gas flow-rate can be adjusted in the range from 5:1 to 10:1. In the preferred embodiment, the argon flow-rate is 300 sccm (Standard Cubic Centimeter per Minute), and the acetylene flow-rate is 30 sccm. The predetermined temperature used in the method can be in the range from 600 to 720° C. In the preferred embodiment, the predetermined temperature is in the range from 620 to 690° C.

Due to catalyzing by the first catalyst 22, the carbon source gas supplied into the reaction chamber 28 is pyrolyzed in a gas phase into carbon units (C=C or C) and free hydrogen ($H_2$). The carbon units are absorbed on a free surface of the first catalyst 22 and diffused into the first catalyst 22. When the first catalyst 22 is supersaturated with the dissolved carbon units, carbon nanotube growth is initiated. As the intrusion of the carbon units into the first catalyst 22 continued, an array of carbon nanotubes is formed. The array of the carbon nanotubes formed by the preferred embodiment is a multi-walled carbon nanotube array. Density, diameter and length of the multi-walled carbon nanotube array can be controlled by adjusting the flow rates of the carbon source gas and the carrier gas, and by altering the predetermined temperature and the reaction time. In addition, the second catalyst 26 used in the first embodiment can act on the carbon source gas. The second catalyst 26 can pyrolize the carbon source gas to produce small amounts of hydrogen gas flows to the first catalyst 22. The additional hydrogen produced by the second catalyst 26 can activate the first catalyst 22, and further reduce the concentration of the carbon source gas around the first catalyst 22. As such, the growth speed of the carbon nanotubes is increased and the height of the array of the carbon nanotubes is enhanced. In the preferred first embodiment, the reaction time is in the range from 30 to 60 minutes. The synthesis method can produce carbon nanotubes with a length greater than 3-400 micrometers, and have a diameter in the range from 10 to 30 nanometers.

In addition, it is noted that the second catalyst 26 can be disposed in other place on the second route proximate to the substrate 20 in the quartz boat 24. Advantageously, the hydrogen produced by the second catalyst 26 and the carbon source gas can reach the first catalyst 22 along the route of airflow, and activate the first catalyst 22 to improve the growth speed of the carbon nanotubes.

Figure 7:
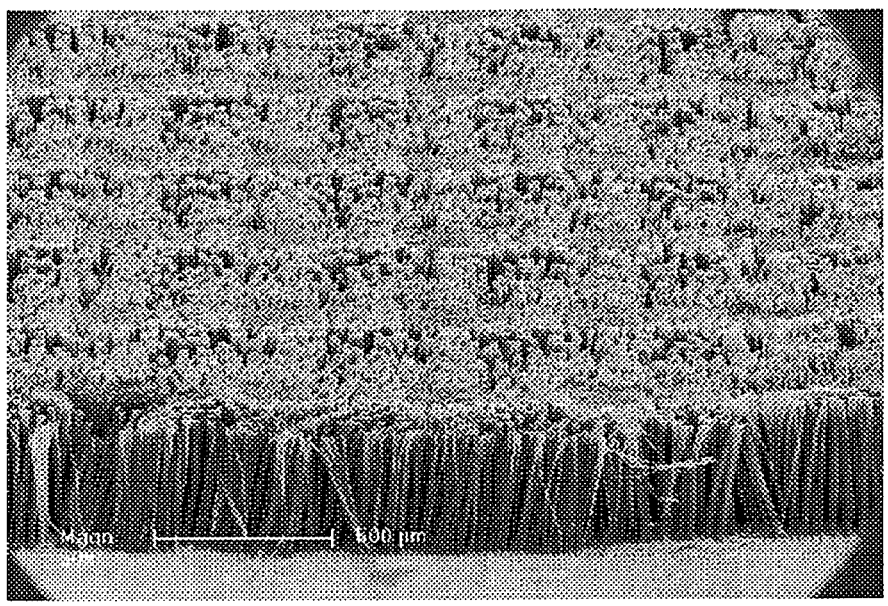
FIG. 7 shows a Scanning Electron Microscope (SEM) image of the array of carbon nanotubes formed by the method of FIG. 1.
Figure 8:
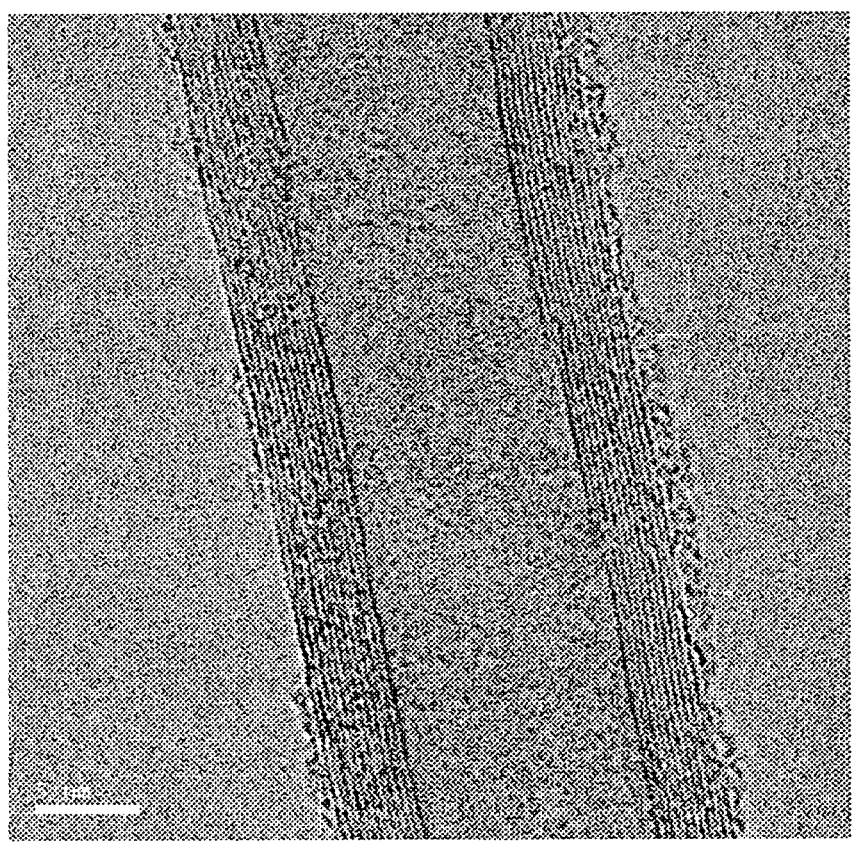
FIG. 8 shows a Transmission Electron Microscope (TEM) image of the array of carbon nanotubes formed by the method of FIG. 1.

Referring to FIGS. 7 and 8, an SEM image and a TEM image of the multi-walled carbon nanotube array formed by the present method are shown. It can be seen that the carbon nanotubes in the carbon nanotube array are highly bundled and super-aligned. The height of the carbon nanotube array is about 300 micrometers.

In the present method, the second catalyst 16, 26 can be metallic powder or netting made of pure iron or nickel. During the synthesis process of the array of the carbon nanotubes, the second catalyst 16, 26 pyrolizes the carbon source gas to produce small amounts of hydrogen. The hydrogen can activate the first catalyst 12, 22 and reduce the consistency of the carbon source gas around the first catalyst 12, 22. As such, the growth speed of the carbon nanotubes is improved and the height of the array of the carbon nanotubes can be from a few hundred micrometers to a few millimeters.

In the preferred methods, the method for making the second catalyst 16, 26 powder includes the following steps Firstly, a powder of about 11.32 grams of ferric nitrate and about 8 g of alumina are immersed in an ethanol solution of 100 milliliters. Secondly, the mixture solution is stirred for about eight hours, and then vaporized by a revolving evaporator for about 12 hours at a temperature of about 80° C. Thirdly, the remainder after vaporizing is ball milled to produce a second catalyst powder. In addition, the second catalyst powder used in the present method can be recycled. After the synthesis process of the array of carbon nanotubes, the second catalyst powder can be collected from the quartz boat. Then, the collected powder can be burned in an oxygen atmosphere to remove the carbon nanotubes and amorphous carbon which adhere to the second catalyst. As such, the second catalyst powder can be used many times repeated and thus the use of the second catalyst adds almost no additional cost.

Furthermore, it is noted that, the shape of the quartz boat of the present apparatus can be varied. The disposed place of the second catalyst relates to the shape of the quartz boat and the direction of the gas flowing in the quartz boat. In particularly, when the quartz boat is cymbiform including two opposite open ends with one end facing towards the gas inlet and the other facing towards the gas outlet of the reaction chamber (referring to the first embodiment of the present apparatus), the second catalyst is disposed beside at least one side of the substrate far from the gas outlet. Alternatively, when the quartz boat is tubular including one open end facing to the gas inlet (referring to the second embodiment of the present apparatus), the second catalyst is disposed beside at least one side of the substrate far from the gas inlet. Furthermore, because the purpose of adopting the second catalyst in accordance with the present apparatus and method is for providing small amounts of additional hydrogen gas around the film of first catalyst, the disposing of the second catalyst should obey the following conditions. Firstly, that the second catalyst should be disposed beside the substrate to assure that the hydrogen produced by the second catalyst can act on the first catalyst directly Secondly, that the second catalyst should be disposed in front of the substrate along a direction of gas flow that ensures that the hydrogen produced by the second catalyst can reach the first catalyst. Also, it is to be understood that the second catalyst should be placed within the range of protection of the present apparatus and methods.

It is noted that, the reaction chamber of the present apparatus includes apparatuses for use in chemical vapor deposition, such as horizontal CVD devices, vertical CVD devices and a CVD device with a removable quartz boat. Moreover, the present apparatus and method can synthesize massive carbon nanotube arrays by disposing a plurality of substrate in the reaction chamber simultaneously, and that the property of carbon nanotubes thus produced is essentially uniform. Thus, both quality and production of the carbon nanotubes can be controlled by the present apparatus and method. Furthermore, the film of first catalyst of the present apparatus and method can be patterned for growing a patterned carbon nanotube array.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

We claim:

1. A method for making an array of carbon nanotubes, comprising the steps of:
   providing a substrate with a first catalyst thereon;
   disposing the substrate on a quartz boat;
   disposing a second catalyst on the quartz boat and adjacent to the substrate on the quartz boat;
   disposing the quartz boat in a reaction chamber having a gas inlet configured for introducing a carbon source gas and a carrier gas into the reaction chamber and a gas outlet;
   heating the reaction chamber to a predetermined temperature and introducing the carbon source gas into the reaction chamber along a direction from the second catalyst to the substrate, whereby the second catalyst reacts with the carbon source gas thereby producing a resultant for promoting catalytic activity of the first catalyst; and
   growing an array of carbon nanotubes on the substrate;
   wherein the first and second catalysts are in different forms, and the second catalyst is in direct contact with the quartz boat and beside the substrate.

2. The method as claimed in claim 1, wherein the second catalyst is comprised of iron, nickel or alumina.

3. The method as claimed in claim 1, further comprises the step of introducing a carrier gas into the reaction chamber prior to heating the reaction chamber.

4. The method as claimed in claim 3, wherein a flow rate of the carrier gas is about five to ten times greater than that of the carbon source gas.

5. The method as claimed in claim 3, wherein the carrier gas is comprised of nitrogen gas and noble gas.

6. The method as claimed in claim 1, wherein the carbon source gas is selected from a group consisting of ethylene, methane, acetylene and ethane.

7. The method as claimed in claim 6, wherein the carbon source gas is comprised of acetylene.

8. The method as claimed in claim 1, wherein the first catalyst is comprised of iron, cobalt, nickel and any combination alloy thereof.

9. The method as claimed in claim 1, wherein the predetermined temperature is in the range of 600 to 720° C.

10. The method as claimed in claim 1, wherein the carbon source gas is introduced into the reaction chamber for 30 to 60 minutes.

11. The method as claimed in claim 1, wherein a pressure in the reaction chamber is maintained at one atmospheric pressure.

12. The method as claimed in claim 1, further comprising the recycling the second catalyst.

13. The method as claimed in claim 1, wherein the first catalyst is in the form of a film and the second catalyst is in the form of a powder or a netting.

14. A method for making an array of carbon nanotubes, comprising the steps of;
   providing a substrate with a film of a first catalyst thereon;
   disposing the substrate and a second catalyst on a tubular boat, the tubular boat having an open end configured for introducing of a carbon source gas thereinto and an opposite closed end configured for blocking and directing the introduced carbon source gas in the tubular boat to flow toward the substrate, the second catalyst being configured for reaction with the carbon source gas thereby producing a resultant for promoting catalytic activity of the first catalyst, the second catalyst being disposed on the tubular boat in a manner to enable the resultant associated with the second catalyst to forcedly flow toward the substrate;

disposing the tubular boat in a reaction chamber having a gas inlet configured for introducing the carbon source gas and a carrier gas into the reaction chamber and a gas outlet;

heating the reaction chamber to a predetermined temperature and introducing the carbon source gas into the reaction chamber; and growing an array of carbon nanotubes on the substrate;

wherein the second catalyst is in the form of a powder or a netting, and the second catalyst is in direct contact with the quartz boat and beside the substrate.

15. The method as claimed in claim 14, further comprising the recycling the second catalyst.

16. A method for making an array of carbon nanotubes, comprising the steps of:

providing a substrate with a first catalyst thereon;

disposing the substrate and a second catalyst on the boat; wherein the second catalyst is adjacent to the first catalyst;

placing the boat in a reaction chamber having a gas inlet configured for introducing a carbon source gas and a carrier gas into the reaction chamber and a gas outlet;

heating the reaction chamber to a predetermined temperature and introducing the carbon source gas into the reaction chamber;

reacting of second catalyst with the carbon source gas thereby producing a resultant;

promoting catalytic activity of the first catalyst with the resultant; and growing an array of carbon nanotubes on the first catalyst; wherein the second catalyst is not located on the substrate.

17. The method as claimed in claim 16, wherein the carbon source gas is introduced along a direction from the second catalyst to the film of the first catalyst.

18. The method as claimed in claim 16, wherein the first catalyst is in the form of a film and the second catalyst is in the form of a powder or a netting.

* * * * *